United States Patent
Heid

(10) Patent No.: US 7,495,442 B2
(45) Date of Patent: Feb. 24, 2009

(54) METHOD FOR COOLING COILS AND SHIM IRON

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/587,780

(22) PCT Filed: Dec. 17, 2004

(86) PCT No.: PCT/EP2004/053557

§ 371 (c)(1),
(2), (4) Date: Jun. 2, 2007

(87) PCT Pub. No.: WO2005/073746

PCT Pub. Date: Aug. 11, 2005

(65) Prior Publication Data

US 2007/0272394 A1    Nov. 29, 2007

(30) Foreign Application Priority Data

Jan. 30, 2004    (DE) .................. 10 2004 004 814

(51) Int. Cl.
*G01V 3/00* (2006.01)
(52) U.S. Cl. .............. 324/318; 324/322; 62/79
(58) Field of Classification Search .......... 324/318, 324/322; 62/79, 115, 149
See application file for complete search history.

(56) References Cited

U.S. PATENT DOCUMENTS

| 4,205,532 | A | * | 6/1980 | Brenan | ................. 62/115 |
| 6,100,693 | A | | 8/2000 | Eberler et al. | |
| 6,783,059 | B2 | * | 8/2004 | Laskaris et al. | ............ 324/318 |
| 6,810,946 | B2 | * | 11/2004 | Hoang | ................. 165/104.26 |
| 6,867,592 | B2 | | 3/2005 | Gebhardt et al. | |
| 6,923,011 | B2 | * | 8/2005 | Manole | ................. 62/149 |

FOREIGN PATENT DOCUMENTS

EP    1 085 287    3/2001

OTHER PUBLICATIONS

The Properties of Gases and Liquids, Reid et al, pp. 518-520.
German Jet Engine and Gas Turbine Development 1930-1945, Kay, Airlife, England, pp. 214,215.

* cited by examiner

*Primary Examiner*—Louis M Arana
(74) *Attorney, Agent, or Firm*—Schiff Hardin LLP

(57) ABSTRACT

A cooling system for electrical coils, such as a coil in a magnetic resonance tomography apparatus, has a heat dissipation device with a fluid and a tempered reservoir for the fluid. The fluid is thermally coupled to the coil and the tempered reservoir is temperature-regulated to maintain the fluid at a fluid temperature and a fluid pressure that are in the immediate proximity of the critical point of the fluid. The cooling system is also suitable for cooling shim iron in a magnetic resonance tomography apparatus, in which case the coupling is in thermal communication with a container for the shim iron.

15 Claims, 3 Drawing Sheets

METHOD FOR COOLING COILS AND SHIM IRON

BACKGROUND OF THE INVENTION

1. Field of the Invention

The present invention generally concerns the cooling of electrical coils. The present invention in particular concerns a cooling method for better heat dissipation at gradient coils and shim systems of magnetic resonance tomography apparatuses.

2. Description of the Prior Art

Electrical coils generally possess a power or stability limit that is defined by the limited dissipation of the heat due to ohmic loss. Such coils are used in magnetic resonance tomography (MRT), for example in the form of gradient coils and shim coils.

Gradient coils serve for the spatial coding inside an MRT apparatus by generating a three-dimensional orthogonal gradient field that is superimposed on the static homogeneous basic magnetic field in the x-direction, y-direction and z-direction. The x-coil and y-coil are typically a coil type known as saddle coils that are rotated with respect to one another by 90° with regard to the z-axis. The z-coil represents a Maxwell coil.

An exact image reconstruction in MRT is only possible when, during the measurement, the gradient coils exhibit a sufficient temporal magnetic field stability and the static basic magnetic field is sufficiently homogeneous.

Among other things, two techniques are known for homogenization of the basic field magnets:

1. A further orthogonal coil system with current flowing through it is located within the orthogonal gradient system, with which it is possible to homogenize the basic field magnet. These additional correction coils (also called shim coils) serve to compensate field inhomogeneities of higher orders and are designed in a very complicated manner in that they are interwoven with the gradient coils.

2. For further homogenization of the basic magnetic field, a suitable arrangement of paramagnetic bodies (shim irons) that are integrated into the gradient coil is calculated with the aid of a field calculation program. The curve of the magnetic field lines of the base field and of the gradient fields can be influenced by the size and position of the shim irons. An advance measurement of the field distribution serves as a basis for the calculation. Another control measurement is conducted after the mounting. This process must be repeated multiple times before a satisfactory shim result is achieved. The shim irons typically are introduced into drawers axially in openings known as shim channels in the tube wall of the gradient system. In order to avoid or to minimize eddy currents in the shim irons, the respective shim iron blocks (composed of playing card-sized shim plates) are stacked.

The technique under point 1 is known as active shimming, the technique under point 2 is known as passive shimming. The combination of both techniques is known as a shim system.

The purpose of the gradient coil current supply and shim coil current supply is to generate current pulses of precise amplitude and at precise times, corresponding to the measurement sequence used. The required currents are approximately 250 amperes, the current rise rate is in the range of 250 kA/s.

Under such conditions a large amount of heat arises in the gradient coils and in the shim coils due to electrical power loss on the order of approximately 20 kW, which heat must be actively dissipated in order to prevent the electromagnetic behavior of the gradient and shim system (and therewith the imaging itself) from being impaired.

A heating of the shim irons (due in part to ohmic losses of eddy currents that cannot be avoided, due in part to heat transfer of the gradient and shim coil heat via the sealing material) cannot be avoided and would significantly impair the shimming if the shim irons were not cooled. However, the heating of the shim irons is smaller by orders of magnitude (approximately 5 W) than that of the gradient coils and shim coils, which is why an elaborate active cooling of the individual shim irons is not absolutely necessary.

According to the prior art, the cooling of convention electrical coils as well as the cooling of gradient coils, shim coils and shim irons in magnetic resonance tomography ensues either by air surface cooling (air blown past) or by water cooling. Active water cooling has conventionally represented the most efficient cooling. The heat is typically transferred from the conductors to be cooled into heat-dissipating flowing water via more or less poorly-conductive plastic layers. The resulting resistance to heat flow limits the maximal capacity of the water cooling.

SUMMARY OF THE INVENTION

An object of the present invention is to provide a cooling system with a much more efficient cooling capability in order to cool electrical coils and heat sources with low technical expenditure, in particular in magnetic resonance tomography.

The above object is achieved in accordance with the invention by an electrical coil with a cooling system, wherein the cooling system includes a heat dissipation device with a fluid and a tempered reservoir containing this fluid, and wherein the coil is coupled to the tempered reservoir by the fluid, and the reservoir is temperature-regulated so that the temperature as well as the pressure of the fluid is kept in the immediate proximity of the critical point of the fluid.

In a first embodiment of the invention, the coupling ensues via a tube that conducts heat well, which tube contains the fluid and is situated in thermal contact with the coil conductor in that it passes through the electrical coil.

In a second embodiment of the invention, the coupling ensues via the conductor of the electrical coil itself, in that this is fashioned tube-like and contains the fluid.

In a third embodiment, the coupling ensues via a heat-insulating tube inside which the coil conductor is coaxially directed and which simultaneously contains the fluid.

The critical temperature of the fluid advantageously corresponds to approximately room temperature.

According to the invention, carbon dioxide or $C_2F_6$ is suitable for use as the fluid.

In order to achieve optimal cooling, the temperature and pressure of the fluid in the reservoir are kept in immediate proximity of the critical point by a heat exchanger.

In another embodiment of the invention, the electrical coil is a gradient coil for a magnetic resonance tomography apparatus with a cooling system as described above. The gradient coil can be a transverse gradient coil and/or an axial gradient coil.

In a further embodiment of the invention, the electrical coil is a shim coil for a magnetic resonance tomography apparatus with a cooling system as described above.

The above object also is achieved in accordance with the invention by a nuclear magnetic resonance tomography apparatus shim irons and a cooling system, wherein the cooling system has a heat dissipation device with a fluid and a tempered reservoir containing this fluid, and wherein the shim irons are coupled to the tempered reservoir by the fluid and the reservoir is temperature-regulated so that the temperature as well as the pressure of the fluid is kept in immediate proximity of the critical point of the fluid.

In an embodiment of the invention, the shim irons are disposed in shim iron channels that are thermally coupled to a tube system containing the fluid.

The critical temperature of the fluid preferably corresponds approximately to room temperature.

It is advantageous to use carbon dioxide or $C_2F_6$ as the fluid.

According to the invention, the temperature and pressure of the fluid in the reservoir are kept in the immediate proximity of the critical point by a heat exchanger.

DESCRIPTION OF THE PREFERRED EMBODIMENTS

As described above, electrical coils (such as, for example, sealed gradient coils or shim coils in MRT apparatuses) are presently air- or water-cooled, which leads to a distinct limitation of the heat dissipation capacity due to the poor heat conductivity of the sealing material. The present invention represents a significant improvement over such conventional cooling systems. For heat transfer, the nearly unlimited large heat conductivity of fluids in the range of their critical point is utilized.

The anomaly of the heat conductivity coefficient $\lambda$ of a fluid in the proximity of the critical point has been long known and is, for example, briefly described in the book "The properties of gases & liquids, Reid, Prausnitz, Poling, McGraw-Hill Book Company, 4th edition, ISBN 0-07-051799-1" on the pages 518 through 520.

Figure 5:
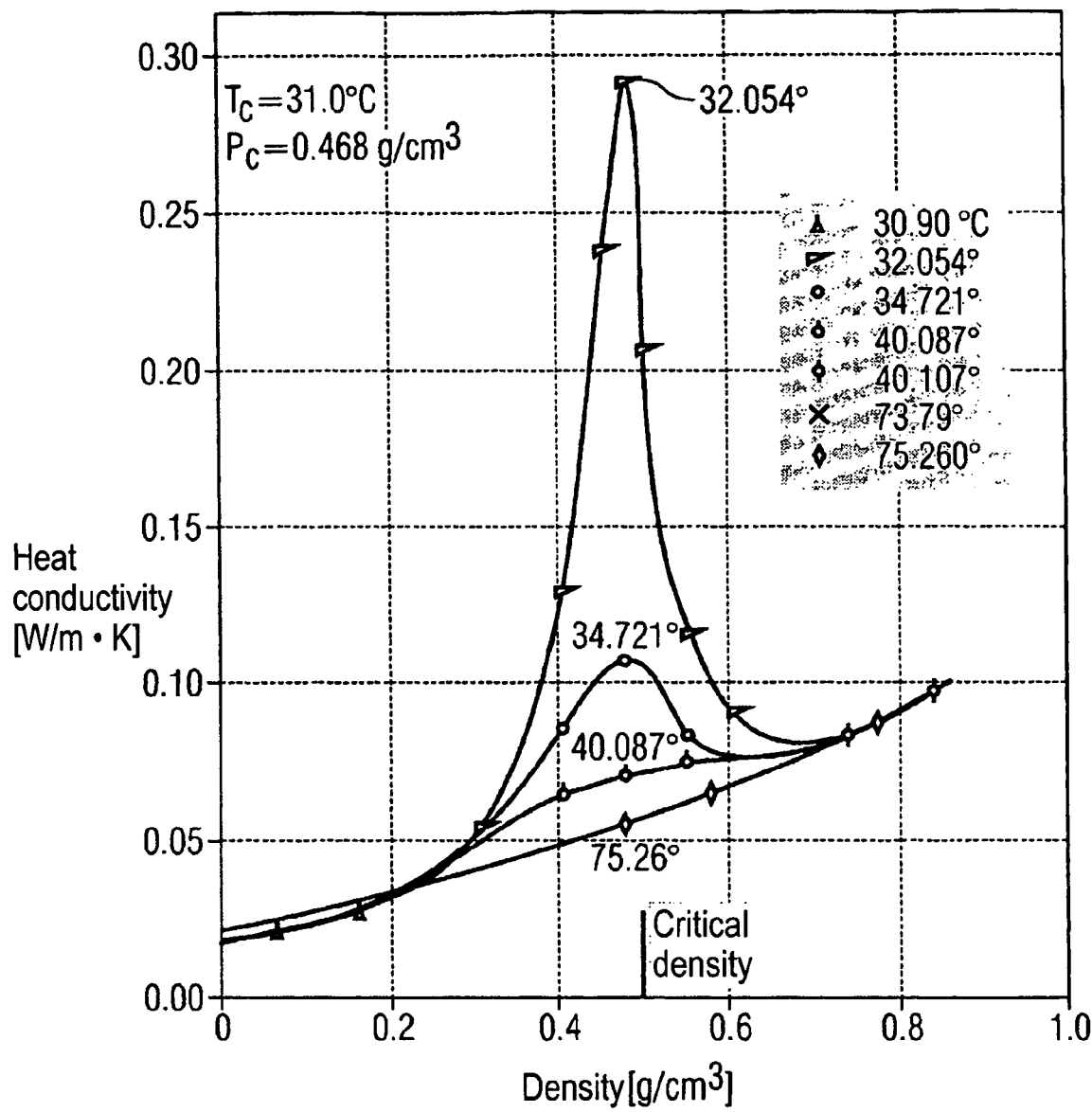
FIG. 5 shows the anomaly of the heat conductor coefficients of CO2 in the proximity of the critical point.

The heat conductivity $\lambda$ of carbon dioxide ($CO_2$) is graphically represented in FIG. 5 dependent on the density at different temperatures (FIG. 5 was taken from the aforementioned literature passage). Shown are four curves of $\lambda$ (measured in W/mK) in the range of the critical density ($\rho_c$=0.468 g/cm$^3$) at temperatures of 75, 40, 34 and 32° C., The graph shows a distinct, significant rise of $\lambda$ in a relatively narrow range of the critical density (±0.1 g/cm$^3$) the more that the temperature approaches the critical temperature ($T_c$=31° C.). The $\lambda$ of $CO_2$ at 32° C. is thus already six times (0.3 W/mK) the value as at 75° C. (0.05 W/mK). Ultimately, at 31° C. a nearly infinite value is theoretically expected (not shown in FIG. 5).

A clear explanation of this phenomenon is not provided. The conjecture is expressed that microscopic molecular phase or order transitions could be responsible or microscopic flow effects due to molecular cluster movements.

A technical application of this effect was described for the first time in "German Jet Engine and Gas Turbine Development 1930-1945, Anthony L. Key, Airlife, England" on the pages 214/215. In the framework of examinations regarding cooling methods for gas turbine blades, Prof. Ernst Schmidt began in 1938 with studies of the heat conductivity of fluids in the range of the critical point. In order to demonstrate the theoretically infinite heat conductivity at the critical point, a steel tube was filled to one-third with liquid ammonia ($NH_3$). With practically all gases the density in the fluid state corresponds to approximately three times the density of the critical state. The cited ammonia filling to a third also simultaneously leads to the critical pressure at the critical temperature. After a heating to 20° C., the tube exhibited a heat conductivity like that of pure copper. After further temperature increase to the critical temperature ($T_c$=132° C.)—it is reported—the heat conductivity of the tube now exceeded that of copper by 20 times.

For cooling gas turbine blades, the described effect was translated to water, by water vapor with critical temperature (374° C.) was being forced through turbine blades at a critical pressure of 76 bar.

According to the present invention, the described effect is utilized to keep electrical coils (as are, for example, used in MRT apparatuses as gradient coils and shim coils) at operating temperature. According to the invention, for this purpose the portion of the conductor to be cooled is thermally coupled to a fluid reservoir via a heat sink (for example a cooling tube). The fluid system is filled with a fluid at approximately critical temperature and critical pressure. This pressure and this temperature are maintained or regulated by a heat exchanger or a pressure regulator.

The conductor portion to be cooled thus is in direct contact with the fluid reservoir in this manner via extremely good heat conduction. The transport of a carrier medium for heat dissipation to the point to be cooled (as was previously necessary for active water cooling) is no longer necessary. For this reason no boundary layer effects (Prandtl boundary layer) that significantly increase the heat transfer resistance exist in the inventive fluid system.

The viscosity of the fluid as a static medium is not relevant in the inventive cooling system. The heat capacity of the fluid is only important insofar as it concerns the rapidity of the heat dissipation of the reservoir (and therewith the regulation inertia of the fluid system. In contrast to heat pipes, gravity has no influence; the heat conduction ensues similarly in the fluid in every spatial direction.

$C_2F_6$ is suitable as a filling gas for the operation at room temperature (approximately 293 K, 20° C.), the critical pressure of which is a controllable 30 bar and the critical temperature of 292 K (19° C.) lies only a little below the operating temperature.

$CO_2$, with a critical pressure of 72 bar and a critical temperature of 301 K (minimally above the operating temperature), would also be suitable. The latter has the advantage that a slight heating even further improves the already high thermal conductivity due to approaching the critical point and therewith stabilizes the temperature of the conductor.

According to the invention, various types of thermal coupling of the element (coil conductor or shim iron) to be cooled are possible.

Figure 2:
FIG. 2 shows an embodiment wherein coupling of an electrical coil via the conductor itself.

In a first exemplary embodiment according to FIG. 2, the coil conductor is fashioned as a tube 1 in which the aforementioned fluid 2 is located.

Figure 3:
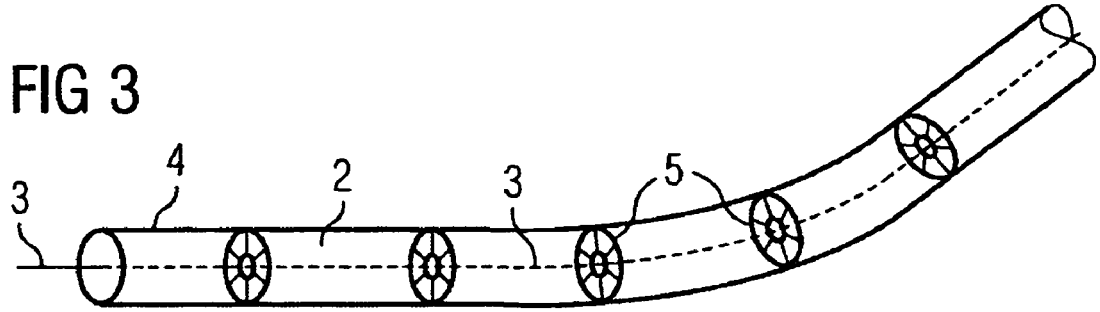
FIG. 3 shows an embodiment wherein coupling of an electrical coil via a coaxially-directed conductor in a fluid-filled insulator.

In a second exemplary embodiment according to FIG. 3, the conductor 3 is surrounded by a fluid-filled hollow tube 4 whose tube wall is electrically insulating and poorly thermally conductive, such that the heat is conducted along the tube inside 4; surrounding carrier structures are, however, not heated. The conductor 3 can be held (for example as in a coaxial cable) with support ribs 5 in the hollow tube 4.

In both exemplary embodiments the tube inside 2 is connected with the cooled fluid reservoir.

Figure 4:
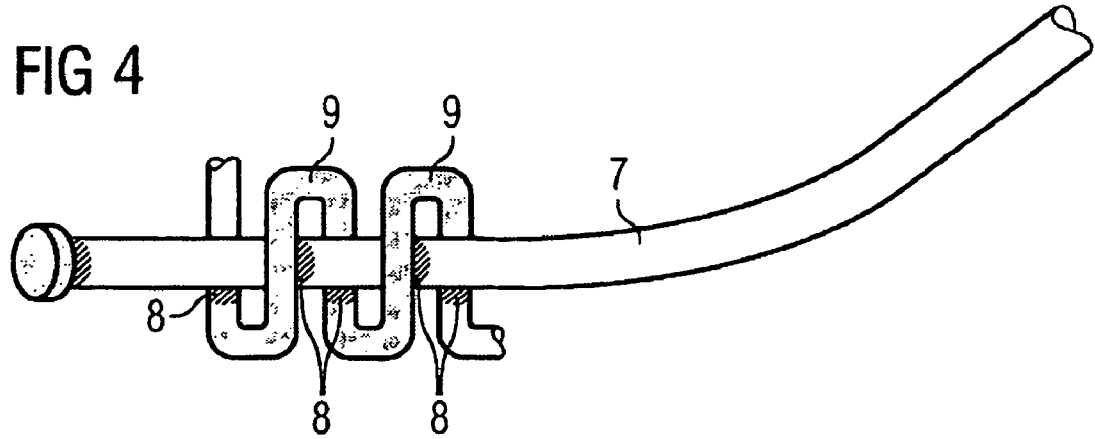
FIG. 4 shows an embodiment wherein coupling of an electrical coil ensues via fluid-filled thermal conductor that is in thermal contact with the electrical conductor of the coil at suitable points.

In a third inventive embodiment according to FIG. 4, the electrical coil 9 to be cooled is pervaded with a separate fluid-filled tube 7 which has thermal contact with the coil conductor 9 at a number of points 8 and is connected at least at one end with the cooled fluid reservoir 6.

As already mentioned above, it is normally also necessary to cool the shim irons 10 in order to ensure or maintain the homogeneity of the basic magnetic field. Although the heating of the shim irons 10 is much lower than that of the gradient or shim coil conductor, a heat dissipation is necessary, for which the described effect can also be utilized according to the invention.

Figure 1:
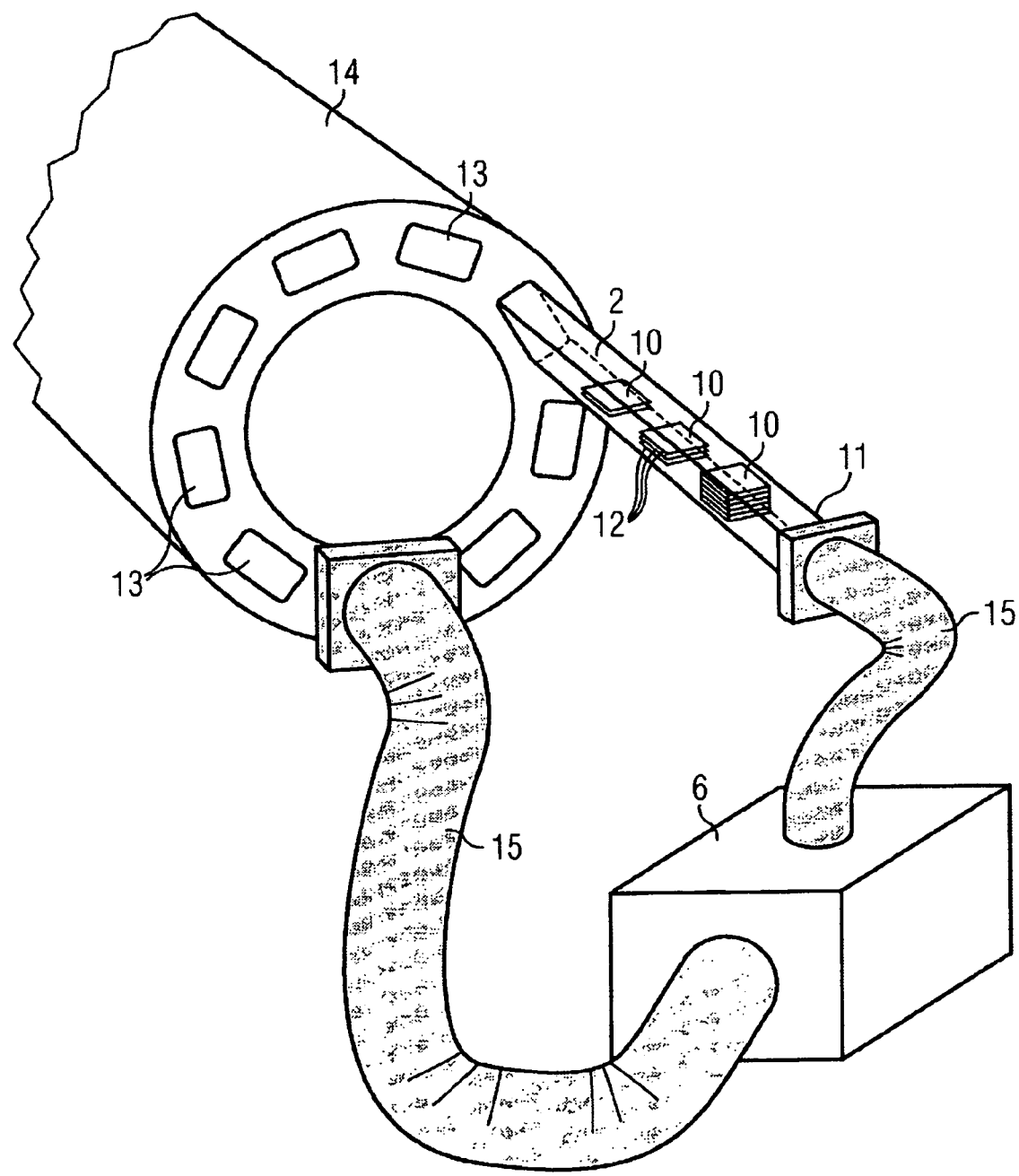
FIG. 1 shows in perspective the gradient shim system of a MRT apparatus with a coupling of two shim channels to a fluid reservoir in accordance with the invention.

The shim irons typically are arranged in drawer-like insertions 11. The number of the shim plates 12 in the different shim irons (also called shim stacks) can be different. For example, FIG. 1 shows an insertion 11 with three shim irons (shim stacks) 10, the front stack having five shim plates 12, the middle stack having three shim plates 12 and the rear stack having two shim plates 12. An insertion 11 with sixteen to eighteen shim iron stacks is normally located in a shim channel 13, with sixteen shim channels in total that are radially, uniformly distributed in the gradient coil body 14, preceding axially. The insertions 11 are axially inserted at the front side.

Cooling of the shim irons 10 using the effect described above ensues according to the invention via a coupling of all shim channels 13 (in which are respectively located the drawer-like insertions 11) to a tempered fluid reservoir 6. The coupling ensues via (thermo) conduits 15 that are flanged at the front side thereof at the corresponding shim channels 13. Two such conduits 15 are shown in FIG. 1. Each shim channel 13 is filled with the fluid 2 which is tempered by communicating the conduits 15 with the reservoir 6 at critical temperature. The heat of the shim irons 10 is directly dissipated via the fluid reservoir 6 in this manner.

A less elaborate cooling of the shim irons 10 is to couple the conduits 15 with a passive heat sink, for example with an outer covering of the basic field magnet, and to forego the fluid reservoir 6. Such a design of the shim iron cooling, however, is efficient only when a certain heat capacity of the shim irons 10 is not exceeded.

Although modifications and changes may be suggested by those skilled in the art, it is the invention of the inventor to embody within the patent warranted heron all changes and modifications as reasonably and properly come within the scope of his contribution to the art.

The invention claimed is:

1. An electrical coil and cooling system combination, comprising:
   an electrical coil;
   a heat dissipation device comprising a fluid and a tempered reservoir for said fluid;
   a thermal coupling that interacts with said electrical coil to place said fluid in thermal communication therewith to dissipate heat from said electrical coil; and
   said fluid flowing through said coupling and having a critical point for a temperature of said fluid and a pressure of said fluid, and said reservoir being temperature-regulated to maintain said fluid in immediate proximity of said critical point.

2. A combination as claimed in claim 1 wherein said electrical coil comprises a conductor having a conductor configuration, and wherein said coupling comprises a heat conducting tube in which said fluid flows that passes through said conductor configuration.

3. A combination as claimed in claim 1 wherein said electrical coil comprises a hollow conductor, forming said coupling, in which said fluid flows.

4. A combination as claimed in claim 1 wherein said electrical coil comprises a conductor, and wherein said coupling comprises a heat-insulating tube having a hollow tube interior in which said fluid flows and through which said conductor proceeds.

5. A combination as claimed in claim 1 wherein said fluid is a fluid for which said critical point is approximately room temperature.

6. A combination as claimed in claim 5 wherein said fluid is a fluid selected from the group consisting of $CO_2$ and $C_2F_6$.

7. A combination as claimed in claim 1 comprising a heat exchanger in thermal communication with said reservoir to maintain said reservoir in said immediate proximity of said critical point of said fluid.

8. A combination as claimed in claim 1 wherein said electrical coil has a coil configuration forming a transverse gradient coil for a magnetic resonance tomography apparatus.

9. A combination as claimed in claim 1 wherein said electrical coil has a coil configuration forming an axial gradient coil for a magnetic resonance tomography apparatus.

10. A combination as claimed in claim 1 wherein said electrical coil has a coil configuration forming a shim coil for a magnetic resonance tomography apparatus.

11. A magnetic resonance tomography apparatus comprising:
    a magnetic resonance scanner adapted to interact with an examination subject to acquire magnetic resonance signals therefrom, said scanner comprising a magnet that generates a static basic magnetic field, at least one gradient coil that generates a gradient magnetic field, and shim iron that shims said static basic magnetic field;
    a heat dissipation device comprising a fluid and a tempered reservoir for said fluid;
    a coupling that thermally couples said fluid with at least one of said gradient coil and said shim iron; and
    said fluid flowing through said coupling and having a critical point for a temperature of said fluid and a pressure of said fluid, and said reservoir being temperature-regulated to maintain said fluid in immediate proximity of said critical point.

12. A magnetic resonance tomography apparatus as claimed in claim 11 wherein said scanner has shim channels therein in which said shim iron is disposed, and wherein said coupling comprises a tube system in which said fluid flows, said tube system being in thermal communication with said shim channels.

13. A magnetic resonance tomography apparatus as claimed in claim 11 wherein said fluid is a fluid having said critical temperature at approximately room temperature.

14. A magnetic resonance tomography apparatus as claimed in claim 13 wherein said fluid is a fluid selected from the group consisting of $CO_2$ and $C_2F_6$.

15. A magnetic resonance tomography apparatus as claimed in claim 11 comprising a heat exchanger in thermal communication with said reservoir to maintain said temperature and said pressure of said fluid in said immediate proximity of said critical point.

* * * * *